US010670629B2

(12) United States Patent
Qu et al.

(10) Patent No.: US 10,670,629 B2
(45) Date of Patent: Jun. 2, 2020

(54) DISPLAY SUBSTRATE, LIGHT-ON DEVICE AND METHOD FOR TESTING ALIGNMENT OF LIGHT-ON TESTING PIN

(71) Applicants: BOE Technology Group Co., Ltd., Beijing (CN); Ordos Yuansheng Optoelectronics Co., Ltd., Inner Mongolia Automomous Region (CN)

(72) Inventors: Yi Qu, Beijing (CN); Guoqing Zhang, Beijing (CN); Zhigang Sun, Beijing (CN); Hongxia Yang, Beijing (CN); Shanshan Bao, Beijing (CN); Jun Wang, Beijing (CN); Tuan Liang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 501 days.

(21) Appl. No.: 15/515,280

(22) PCT Filed: May 13, 2016

(86) PCT No.: PCT/CN2016/082051
§ 371 (c)(1),
(2) Date: Mar. 29, 2017

(87) PCT Pub. No.: WO2017/166387
PCT Pub. Date: Oct. 5, 2017

(65) Prior Publication Data
US 2018/0188289 A1      Jul. 5, 2018

(30) Foreign Application Priority Data

Mar. 31, 2016  (CN) .......................... 2016 1 0197453

(51) Int. Cl.
*G01R 1/067*    (2006.01)
*G01R 31/44*    (2020.01)
*G01R 1/073*    (2006.01)

(52) U.S. Cl.
CPC ...... *G01R 1/06794* (2013.01); *G01R 1/07314* (2013.01); *G01R 31/44* (2013.01)

(58) Field of Classification Search
None
See application file for complete search history.

(56) References Cited

U.S. PATENT DOCUMENTS 4,342,957 A * 8/1982 Russell ................ G01R 31/025
                                                    324/538
5,844,421 A   12/1998 Lee et al.
2016/0161560 A1* 6/2016 Barden .............. G01R 1/06788

FOREIGN PATENT DOCUMENTS

CN      103345077 A    10/2013
CN      203365611 U    12/2013
(Continued)

OTHER PUBLICATIONS

Li_ 12302015_Machine Translation of CN105204198 A, 2015.*
(Continued)

*Primary Examiner* — Jermele M Hollington
*Assistant Examiner* — Suresh K Rajaputra
(74) *Attorney, Agent, or Firm* — Calfee, Halter & Griswold LLP

(57) ABSTRACT

A display substrate includes: a display driving signal line; and at least one set of testing pads, wherein each set of the testing pads includes: a plurality of light-on testing pads arranged successively and connected to the display driving signal line; and two pin-miss testing pads electrically connected to one another while not connected to the display driving signal line.

17 Claims, 1 Drawing Sheet

(56) References Cited

FOREIGN PATENT DOCUMENTS

| | | | | |
|---|---|---|---|---|
| CN | 203616553 U | 5/2014 | | |
| CN | 104950484 A | * 9/2015 | ............. | G01R 31/28 |
| CN | 104950484 A | 9/2015 | | |
| CN | 105204198 A | * 12/2015 | ............... | G02F 1/13 |
| CN | 105204198 A | 12/2015 | | |
| JP | 2000258744 A | 9/2000 | | |
| JP | 2003043517 A | 2/2003 | | |
| JP | 2004170238 A | 6/2004 | | |
| JP | 2011175298 A | 9/2011 | | |
| KR | 0149325 B1 | 12/1998 | | |

OTHER PUBLICATIONS

Sagara_09302015_Machine Translation of CN104950484 A, 2015.*
International Search Report and Written Opinion for International Application No. PCT/CN2016/082051 dated Nov. 30, 2016.
First Office Action for Chinese Patent Application No. 201610197453.7 dated Jun. 5, 2018.

* cited by examiner

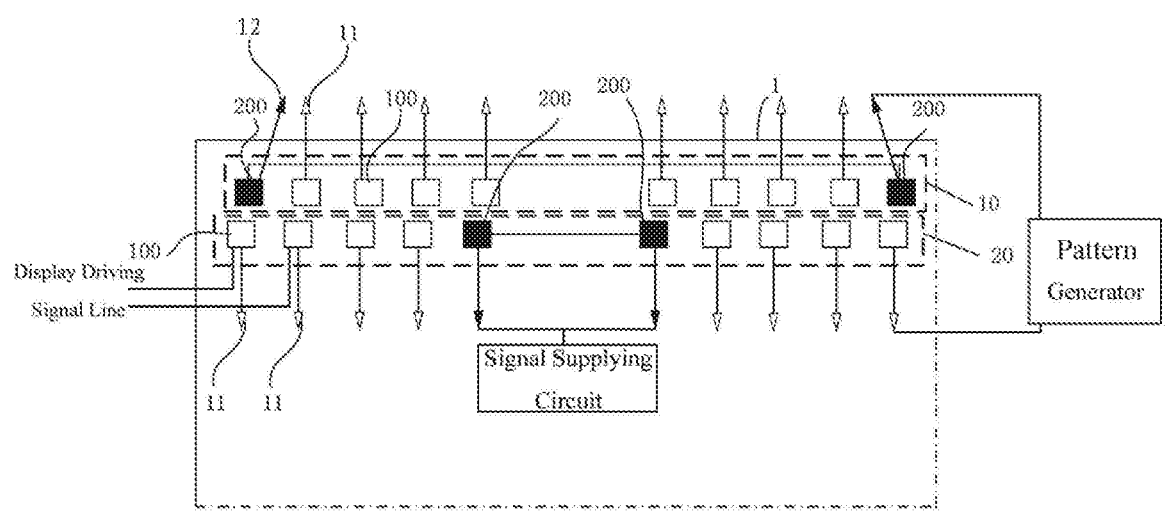

DISPLAY SUBSTRATE, LIGHT-ON DEVICE AND METHOD FOR TESTING ALIGNMENT OF LIGHT-ON TESTING PIN

CROSS REFERENCE

The present application is based upon the international Application No. PCT/CN2016/082051, filed on May 13, 2016, which is based upon and claims priority to Chinese Patent Application No. 201610197453.7, filed on Mar. 31, 2016, and the entire contents thereof are incorporated herein by reference.

TECHNICAL FIELD

The present disclosure relates to the field of display technology, in particular, to a display substrate, a light-on device and a method for testing alignment of light-on testing pins.

BACKGROUND

During the manufacture of display panels such as a liquid crystal display (LCD) display panel and an active-matrix organic light emitting diode (AMOLED) display panel, a plurality of testing processes are required, and among which an important testing process is a cell test (ET) on the display substrate after the cutting process, to determine whether it is defective. The ET test is performed before the driving chip and the flexible circuit board are attached to the display substrate, wherein the flexible circuit board is used for inputting display signals.

The ET test is generally performed by inputting a test signal to the display substrate through a light-on device such that the pixels in the display substrate may present colors, and then observing whether each pixel is defective by the defect detecting device. This process is referred to as a light-on test.

In order to facilitate the test, a testing pad is generally provided on the display substrate (usually the array substrate), and a testing pin of the light-on device is in contact with a test spot on the testing pad, wherein the test spot is connected to a signal line. Accordingly, a testing signal may be input to the signal line through the testing pin and the testing spot to detect whether the display substrate is defective.

A driving chip is provided in a peripheral area of the display substrate. The signal line is provided between the driving chip and the pixel units in the display substrate to establish connection therebetween. The testing pads are provided at both sides of the driving chip and are connected to the signal line.

Pin miss is a frequent device abnormal during the light-on test. Since it is impossible to tell a product defect of the display substrate itself (display abnormal) from the pin miss abnormal only according to the result of the light-on test, problems such as misjudging a good product as a defective product may occur during the manufacturing.

In the related art, in order to determine a pin miss, if a display abnormal has occurred, the inspector takes the display substrate off the testing desk and repositions the display substrate several times to confirm whether there is a pin miss. Such a scheme is time consuming, accuracy unreliable, and susceptible to the inspector's skill.

It should be noted that, information disclosed in the above background portion is provided only for better understanding of the background of the present disclosure, and thus it may contain information that does not form the prior art known by those ordinary skilled in the art.

SUMMARY

Aspects of the present disclosure provide a display substrate, a light-on device and a method for testing alignment of light-on testing pins.

According to one aspect, the present disclosure provides a display substrate comprising a display driving signal line and at least one set of testing pads, wherein each set of testing pads comprises: a plurality of light-on testing pads arranged successively and connected to the display driving signal line; and two pin-miss testing pads electrically connected to one another while not connected to the display driving signal line. Further, the two pin-miss testing pads are positioned respectively at both of the end portions of the plurality of light-on testing pads in the same set of testing pads.

According to another aspect, the present disclosure discloses a light-on device comprising at least one set of pins for performing a light-on test on the above described display substrate, and each set of pins comprising: light-on testing pins for making connection to the plurality of light-on testing pads comprised in one set of testing pads; and pin-miss testing pins for making connection to the pin-miss testing pads comprised in said one set of testing pads, wherein each set of pins has the same arrangement as that of the set of testing pads corresponding to the set of pins.

According to a further aspect, the present disclosure provides a method for testing alignment of light-on testing pins, the method being configured to perform alignment testing of light-on testing pins (e.g., the pin-miss test) on the above mentioned display substrate using the above mentioned light-on device, and the method comprising:

connecting the light-on testing pins and the pin-miss testing pins comprised in one set of pins in the light-on device to the light-on testing pads and the pin-miss testing pads comprised in a corresponding set of testing pads on the display substrate, respectively;

prior to the light-on test, simultaneously applying, from pins connected to the pin-miss testing pads, electrical signals with different voltages for a preset period of time to the two pin-miss testing pads in the same set of testing pads that are electrically connected to one another, and determining whether a current is flowing between the two pin-miss testing pads in the same set of testing pads that are short circuited;

in the case where a current is flowing between the two pin-miss testing pads in the same set of testing pads that are short circuited, determining that the pins are in proper alignment; and in the case where no current is flowing between the two pin-miss testing pads in the same set of testing pads that are short circuited, determining that the pins are miss-pinned.

According to a further aspect, the present disclosure provides a light-on device, comprising:

at least one set of pins, wherein each set of pins comprises:

light-on testing pins for making connection to light-on testing pads in a display substrate; and pin-miss testing pins for making connection to pin-miss testing pads in the display substrate, wherein the light-on testing pins are electrically connected to a display driving signal line in the display substrate while being connected to the light-on testing pads, and the pin-miss testing pins are electrically connected to one another while being connected to the pin-miss testing pads.

According to a further aspect, the present disclosure provides a method for testing pin-miss between a light-on device and a display substrate, including:

connecting light-on testing pins in the light-on device to light-on testing pads in the display substrate, and connecting pin-miss testing pins in the light-on device to pin-miss testing pads in the display substrate, wherein the pin-miss testing pads are electrically connected to one another;

applying, from the pin-miss testing pins, electrical signals with different voltages for a preset period of time to the pin-miss testing pads that are electrically connected to one another, and determining whether a current is flowing between the two pin-miss testing pads in the same set of testing pads that are short circuited;

in the case where a current is flowing between the pin-miss testing pads that are short circuited, determining that the pins are in proper alignment; and in the case where no current is flowing between the pin-miss testing pads that are short circuited, determining that the pins are miss-pinned.

This section provides a summary of various implementations or examples of the technology described in the disclosure, and is not a comprehensive disclosure of the full scope or all features of the disclosed technology.

BRIEF DESCRIPTION OF THE DRAWINGS

Hereinafter, in order to describe the implementations of the embodiments of the present disclosure in further detail, a brief description of the drawings that will be used for describing the embodiments is given below. Obviously, drawings provided in the following description are merely embodiments recorded in the present disclosure, other drawings may be available to those skilled in the art according to these drawings without creative labor. The following drawings are not intentionally drawn to scale in actual size, instead, they are provided mainly for illustrating the spirit of the present disclosure.

FIG. 1 illustrates a schematic structural diagram of an arrangement of the testing pads of the display substrate according to embodiments of the present disclosure.

DETAILED DESCRIPTION

Hereinafter, implementations of the embodiments of the present disclosure will be described clearly and completely with reference to the drawings of the embodiments of the present disclosure, to make the objectives, implementations and advantages of the embodiments of the present disclosure more clear. Obviously, rather than being all the embodiments, the described embodiments are only part of the embodiments of the present disclosure. All other embodiments available to those skilled in the art based on the described embodiments of the present disclosure will fall within the protection scope of the present disclosure.

Unless otherwise defined, all technical or scientific terms used herein are to be interpreted as customary in the art to which the present disclosure belongs. Terms such as "first", "second", and the like used in the description and the claims of the present disclosure do not indicate any order, quantity or importance, instead, they are used to distinguish different components. Likewise, terms such as "a" or "an" or the like are not intended to limit the quantity, but to indicate the presence of at least one. Terms such as "connect" or "connected with" or the like are not limited to physical or mechanical connection, but may comprise electrical connection, either directly or indirectly. Terms such as "upper", "lower", "left", "right" and the like are used to indicate relative positional relations, and the relative positional relation will change correspondingly as the absolute position of the described object changes.

With respect to the technical problems in the related art, such as it is difficult and time consuming to accurately determine pin-miss abnormality while performing a light-on test on the display substrate, embodiments of the present disclosure provide a display substrate, a light-on device and a method for testing alignment of light-on testing pins, thereby automatically determining whether pin-miss abnormality has occurred and increasing the test accuracy.

As illustrated in FIG. 1, embodiments of the present disclosure provide a display substrate 1 comprising a display driving signal line and at least one set of testing pads. A plurality of testing pads in the same set of testing pads are arranged successively. As shown in FIG. 1, for example, the plurality of testing pads in the same set of testing pads are arranged successively along a preset direction. Each set of testing pads comprises a plurality of light-on testing pads (also referred to as ET pads) 100 connected to the display driving signal line. Each set of testing pads further comprises two pin-miss testing pads (also referred to as Dummy pads) 200 electrically connected to one another while not connected to the display driving signal line. It should be noted that, in FIG. 1, only two light-on testing pads 100 at the lower left side are illustrated to be connected to the display driving signal line for clarity, while in fact, all the light-on testing pads 100 are connected to the display driving signal line respectively.

A light-on device according to embodiments of the present disclosure comprises at least one set of pins for performing a light-on test on the above described display substrate. Each set of pins comprising: light-on testing pins 11 for making connection to the plurality of light-on testing pads 100; and pin-miss testing pins 12 for making connection to the pin-miss testing pads 200, wherein each set of pins has the same arrangement as that of the set of testing pads corresponding to the set of pins. The light-on device further comprises: a signal supplying circuit connected to the pin-miss testing pin 12 for providing electrical signals with different voltages to the two pin-miss testing pads 200 in the same set of testing pads. It should be noted that, in FIG. 1, only two pin-miss testing pins 12 at the lower side are illustrated to be connected to the signal supplying circuit for clarity, while in fact, all the pin-miss testing pins 12 are connected to the signal supplying circuit.

In the above implementation, traditional display substrates and light-on devices have been improved, wherein during the manufacturing of the display substrate (e.g., the array mask design), two pin-miss testing pads 200 for determining the occurrence of pin-miss are additionally disposed in each initial set of test pads. The pin-miss testing pads 200 are floated and are not connected to the display region as a driving signal. The two pin-miss testing pads 200 in the same set of testing pads are electrically connected. Correspondingly, the light-on device has been improved. In each initial set of pins in the light-on device, there are additionally provided two pin-miss testing pins 12 correspondingly connected to the pin-miss testing pads 200 and a signal supplying circuit for providing electrical signals with different voltages to the two pin-miss testing pads 200 in a same set of testing pads.

Each set of the pins in the light-on device has the same arrangement as that of the corresponding set of testing pads on the display substrate. Accordingly, if the pin-miss testing pins 12 are normally aligned to the pin-miss testing pads, it may be determined that the light-on testing pins 11 are normally aligned to the light-on testing pads 100. If the pin-miss testing pins 12 are not normally aligned to the pin-miss testing pads, it may be determined that the light-on testing pins 11 are not normally aligned to the light-on testing pads 100, i.e., a pin-miss problem has occurred.

Accordingly, pin-miss testing is performed on the display substrate according to the embodiments of the present disclosure using the light-on device according to the embodiments of the present disclosure, and in detail, the method comprises the steps that follow.

Prior to the light-on test, it may simultaneously apply, from pin-miss testing pins 12 connected to the pin-miss testing pads 200, electrical signals with different voltages for a preset period of time to the two pin-miss testing pads 200 in the same set of testing pads that are electrically connected to one another, and then determine whether a current is flowing between the two pin-miss testing pads 200 in the same set of testing pads that are short circuited. If the pin-miss testing pins 12 are normally aligned to the pin-miss testing pads 200, the pin-miss testing pins 12 will be normally connected to the pin-miss testing pads, and thus a large current may flow between the two pin-miss testing pads having different voltages since the two pin-miss testing pads 200 in the same set of testing pads are electrically connected. Accordingly, in the case where a current is flowing between the two pin-miss testing pads 200 in the same set of testing pads that are short circuited, it is determined that the two pin-miss testing pins 12 in the same set are in proper alignment, correspondingly, other pins which belong to the same set with the above two pin-miss testing pins 12 are in proper alignment. In the case where no current is flowing between the two pin-miss testing pads 200 in the same set of testing pads that are short circuited, it is determined that the pins are miss-pinned.

In addition, during a normal light-on test, the light-on device does not provide any display driving signal to the pin-miss testing pads 200. Thus the short circuit design of the two pin-miss testing pads 200 does not affect the light-on test.

Accordingly, accordingly to the present disclosure, product designs of the display substrate and the light-on device have been improved. Pin-miss abnormality may be automatically detected by applying an electrical signal of the voltage, thereby prompting the inspector to reposition the pins when a pin-miss has occurred. Accordingly, it is possible to eliminate test failure or the like due to the pin-miss and improve inspecting accuracy. During the light-on test, it does not increase additional inspection time, has a high reliability, does not require a contact operation on the display substrate from the inspector, and may reduce the risk of static electricity and product damage.

In one embodiment, it should be noted that, in the above implementation, prior to the light-on test, simultaneously applying electrical signals with different voltages to the two pin-miss testing pads 200 in the same set of testing pads that are short circuited specifically comprises: applying a voltage electrical signal of 0 (zero) V to one pin-miss testing pad 200 of the two pin-miss testing pads 200 in one set of testing pads that are short circuited, and applying a voltage electrical signal of 1~2 V to the other pin-miss testing pad 200.

In one embodiment, the voltage electrical signal applied to the two pin-miss testing pads 200 in one set of testing pads that are short circuited is not limited to the above voltage electrical signal, as long as different voltage electrical signals are applied to the two pin-miss testing pads 200 in one set of testing pads that are short circuited.

Furthermore, prior to the light-on test, electrical signals with different voltages are simultaneously applied for a preset period of time to the two pin-miss testing pads 200 in the same set of testing pads that are short circuited. The electrical signal is a transient signal. The preset period of time is a period of time during which the transient signal is applied. Since the transient signal is applied for a very short period of time, it will not cause short circuit damage on the display substrate and the light-on device.

In addition, the light-on device is generally provided with a pattern generator over current protection (PG OCP) connected to the pins. In the light-on device according to embodiments of the present disclosure, the PG OCP is connected to all of the light-on testing pins 11 and the pin-miss testing pins 12. Thus it is possible to monitor the pin-miss directly using an alarm of the PG OCP. In particular, while performing a pin-miss test, the built-in PG OCP in the light-on device is used to determine whether a current is flowing between the two pin-miss testing pads 200 in the same set of testing pads that are short circuited. When the PG OCP sounds an alarm, it is determined that a current is flowing between the two pin-miss testing pads 200 in the same set of testing pads that are short circuited. When the PG OCP does not sound any alarm, it is determined that no current is flowing between the two pin-miss testing pads 200 in the same set of testing pads that are short circuited. It should be noted that, in FIG. 1, only the light-on testing pin 11 at the most right lower side and the pin-miss testing pin 12 at the most right upper side are illustrated to be connected to the PG OCP for clarity, while in fact, all the light-on testing pins 11 and the pin-miss testing pins 12 are connected to the PG OCP.

In the related art, the light-on device is generally provided with the pattern generator connected to the pins to protect the circuit from over current. In the present disclosure, during a pin-miss test, information regarding pin-miss may be derived from the abnormal event whether the pattern generator sounds an overcurrent alarm. In particular, during the pin-miss test, if the pattern generator sounds an overcurrent alarm, it may be determined that the pins are aligned accurately. If the pattern generator does not sound any overcurrent alarm, it may be determined that a pin-miss has occurred. Accordingly, no additional component is required to determine the pin-miss accurately.

Further, it should be noted that the signal supplying circuit providing electrical signals with different voltage to the two pin-miss testing pads in the same set of testing pads may be provided using the pattern generator. That is, the electrical signals with different voltages may be provided directly to the two pin-miss testing pads using the pattern generator. Alternatively, the signal supplying circuit providing electrical signals with different voltages to the two pin-miss testing pads in the same set of testing pads may be provided separately in the light-on device. Alternatively, an external circuit may be used directly to provide electrical signals with different voltages to the two pin-miss testing pads in the same set of testing pads.

In the display substrate according to embodiments of the present disclosure, optionally, as illustrated in FIG. 1, two pin-miss testing pads 200 are positioned respectively at both of the end portions of the plurality of light-on testing pads 100 in the same set of testing pads. In other words, the pin-miss testing pads 200 are positioned at the boundary position of each set of testing pads, for example, in the case where the testing pads in one set of testing pads are arranged in a line, the first and last one of the testing pads in the line may be the pin-miss testing pads 200. In the above implementation, the pins of the light-on device may form an integrated structure. Thus if pin-miss abnormality has occurred, an offset of the pin-miss at the boundary of each set of testing pads equals to that at the central position if there is no rotational offset between the pins of the light-on device and the pads on the display substrate, and the offset of the pin-miss at the boundary of each set of testing pads may be the greatest if there is a rotational offset. Accordingly, if no pin-miss abnormality has occurred at both of the end positions of each set of testing pads, it may be determined that the testing pads at the central position are normally aligned. Accordingly, it may be more accurate to test pin-miss abnormality by arranging the two pin-miss testing pins 12 at both of the end positions of each set of testing pads.

Obviously, it may be appreciated that in other embodiments of the present disclosure, the two pin-miss testing pads 200 may be positioned at other positions in each set of the testing pads according to actual needs.

In the display substrate according to embodiments of the present disclosure, as illustrated in FIG. 1, the two pin-miss testing pads 200 may also be positioned between two light-on testing pads 100 at the central position of the plurality of light-on testing pads in the same set of testing pads.

FIG. 1 is a schematic diagram of a display substrate according to embodiments of the present disclosure. As an example, FIG. 1 illustrates only the arrangement of two sets of testing pads in the display substrate. It should be appreciated that, in actual applications, the display substrate may comprise a plurality of sets of testing pads. As illustrated in FIG. 1, the display substrate comprises a first set of testing pads 10 and a second set of testing pads 20. In the present embodiment, the two pin-miss testing pads 200 in the first set of testing pads 10 are positioned respectively at both of the end portions of the plurality of light-on testing pads 100 in the first set of testing pads 10. The two pin-miss testing pads 200 in the second set of testing pads 20 are positioned between two light-on testing pads 100 at the central position of the plurality of light-on testing pads 100 in the second set of testing pads 20.

In the above implementation, the two pin-miss testing pads 200 in the first set of testing pads 10 are positioned respectively at both of the end portions of the plurality of light-on testing pads 100 in the first set of testing pads 10. The two pin-miss testing pads 200 in the second set of testing pads 20 are positioned between two light-on testing pads 100 at the central position of the plurality of light-on testing pads 100 in the second set of testing pads 20. That is, the pin-miss testing pads are positioned at different positions in different sets of testing pads. Thus the pin-miss abnormal test may be more accurate compared to the case where the pin-miss testing pads are positioned only at both of the end portions of each set of testing pads or at the central position of each set of testing pads.

Further, as illustrated in FIG. 1, in the display substrate according to the embodiments of the present disclosure, alternatively, a distance between at least some of the light-on testing pads 100 in the same set of testing pads is a first distance. A distance between a pin-miss testing pad 200 and a closest light-on testing pad 100 in the same set of testing pads equals to the first distance.

In the above implementation, a size of the pin-miss testing pad 200 equals to a size of the light-on testing pad 100. The distance among the pin-miss testing pads 200 and the light-on testing pads 100 may be consistent, thereby simplifying the manufacture of the pins in the light-on device.

It should be appreciated that in actual applications, the size of the pin-miss testing pad 200 and the distance between the pin-miss testing pad 200 and the light-on testing pad 100 may be designed according to actual requirements, which are not limited herein.

In addition, two pin-miss testing pads 200 in the same set of testing pads are connected through a metal thin film.

Embodiments of the present disclosure provide a method for testing alignment of light-on testing pins, the method being configured to perform a pin-miss test on the above mentioned display substrate using the above mentioned light-on device, and the method comprising:

connecting the pins in the light-on device with the plurality of testing pads on the display substrate;

prior to the light-on test, simultaneously applying, from pins connected to the pin-miss testing pads 200, electrical signals with different voltages for a preset period of time to the two pin-miss testing pads 200 in the same set of testing pads that are electrically connected to one another, and determining whether a current is flowing between the two pin-miss testing pads 200 in the same set of testing pads that are short circuited;

in the case where a current is flowing between the two pin-miss testing pads 200 in the same set of testing pads that are short circuited, determining that the pins are in proper alignment; and in the case where no current is flowing between the two pin-miss testing pads 200 in the same set of testing pads that are short circuited, determining that the pins are miss-pinned.

According to one embodiment, in the above implementation, prior to the light-on test, particularly, simultaneously applying electrical signals with different voltages for a preset period of time to the two pin-miss testing pads 200 in the same set of testing pads that are electrically connected to one another comprises:

applying a voltage electrical signal of 0 (zero) V to one pin-miss testing pad 200 of the two pin-miss testing pads 200 in the same set of testing pads that are short circuited, and applying a voltage electrical signal of 1~2 V to the other pin-miss testing pad 200.

In the above implementation, it should be noted that the voltage electrical signal applied to the two pin-miss testing pads 200 in the same set of testing pads that are short circuited is not limited to the above voltage electrical signal, as long as different voltage electrical signals are applied to the two pin-miss testing pads 200 in one set of testing pads that are short circuited.

In addition, prior to the light-on test, electrical signals with different voltages are simultaneously applied for a preset period of time to the two pin-miss testing pads 200 in the same set of testing pads that are short circuited, and the electrical signal is a transient signal, and the preset period of time is a period of time during which the transient signal is applied. Since the transient signal is applied for a very short period of time, it will not cause short circuit damage on the display substrate and the light-on device.

Further, a pattern generator over current protection in the light-on device is used to determine whether a current is flowing between the two pin-miss testing pads 200 in the same set of testing pads that are short circuited;

when the pattern generator over current protection sounds an alarm, it is determined that a current is flowing between the two pin-miss testing pads 200 in the same set of testing pads that are short circuited; and when the pattern generator over current protection does not sound any alarm, it is determined that no current is flowing between the two pin-miss testing pads 200 in the same set of testing pads that are short circuited.

In the above implementation, pin alignment may be monitored directly by the alarm of the pattern generator over current protection in the light-on device.

Further, according to another embodiment, a light-on device may comprise: at least one set of pins, wherein each set of pins includes: light-on testing pins for making connection to light-on testing pads in a display substrate; and pin-miss testing pins for making connection to pin-miss testing pads in the display substrate, wherein the light-on testing pins are electrically connected to a display driving signal line in the display substrate while being connected to the light-on testing pads, and the pin-miss testing pins are electrically connected to one another while being connected to the pin-miss testing pads.

In another embodiment, the light-on device may further comprise: a pattern generator over current protection (PG OCP) connected to the light-on testing pin and the pin-miss testing pin.

Furthermore, according to another embodiment, a method for testing pin-miss between a light-on device and a display substrate, comprising: connecting light-on testing pins in the light-on device to light-on testing pads in the display substrate, and connecting pin-miss testing pins in the light-on device to pin-miss testing pads in the display substrate, wherein the pin-miss testing pads are electrically connected to one another; applying, from the pin-miss testing pins, electrical signals with different voltages for a preset period of time to the pin-miss testing pads that are electrically connected to one another, and determining whether a current is flowing between the two pin-miss testing pads in the same set of testing pads that are short circuited; in the case where a current is flowing between the pin-miss testing pads that are short circuited, determining that the pins are in proper alignment; and in the case where no current is flowing between the pin-miss testing pads that are short circuited, determining that the pins are miss-pinned.

In another embodiment, the applying, from the pin-miss testing pins, electrical signals with different voltages for a preset period of time to the pin-miss testing pads that are electrically connected to one another may comprise: applying a voltage electrical signal of 0 (zero) V to one pin-miss testing pad of the pin-miss testing pads that are short circuited, and applying a voltage electrical signal of 1~2 V to the other pin-miss testing pad.

In yet another embodiment, a pattern generator over current protection in the light-on device is used to determine whether a current is flowing between the pin-miss testing pads that are short circuited, and wherein when the pattern generator over current protection sounds an alarm, it is determined that a current is flowing between the pin-miss testing pads that are short circuited; and when the pattern generator over current protection does not sound any alarm, it is determined that no current is flowing between the pin-miss testing pads that are short circuited.

Hereinabove are merely optional implementations of the present disclosure, and it should be noted that various improvements and alternatives are possible to those ordinary skilled in the art without departing from the technical principle of the present disclosure. All these improvements and alternatives will also fall into the protection scope of the present disclosure.

What is claimed is:

1. A display substrate comprising:
a display driving signal line; and
a first set of testing pads and a second set of testing pads,
wherein the first set of testing pads comprises:
a plurality of first light-on testing pads arranged successively and connected to the display driving signal line; and
two first pin-miss testing pads electrically connected to one another while not connected to the display driving signal line,
wherein the second set of testing pads comprises:
a plurality of second light-on testing pads arranged successively and connected to the display driving signal line; and
two second pin-miss testing pads electrically connected to one another while not connected to the display driving signal line,
wherein a first positional relationship between the first light-on testing pads and the first pin-miss testing pads is different from a second positional relationship between the second light-on testing pads and the second pin-miss testing pads.

2. The display substrate according to claim 1, wherein the two first pin-miss testing pads are positioned respectively at both of end portions of the plurality of first light-on testing pads in the first set of testing pads.

3. The display substrate according to claim 1, wherein the two first pin-miss testing pads are positioned between two first light-on testing pads at a central position of the plurality of first light-on testing pads in the first set of testing pads.

4. The display substrate according to claim 1, wherein
a distance between at least some of the first light-on testing pads in the first set of testing pads is a first distance; and
a distance between a first pin-miss testing pad and a closest first light-on testing pad in the first set of testing pads equals to the first distance.

5. The display substrate according to claim 1, wherein
in the first set of testing pads, the two first pin-miss testing pads are positioned respectively at both of end portions of the plurality of first light-on testing pads in the first set of testing pads; and in the second set of testing pads, the two second pin-miss testing pads are positioned between two second light-on testing pads at a central position of the plurality of second light-on testing pads in the second set of testing pads.

6. The display substrate according to claim 1, wherein the two first pin-miss testing pads in the first set of testing pads are connected through a metal thin film.

7. A method for testing alignment of light-on testing pins, the method being configured to perform alignment testing of light-on testing pins on the display substrate according to claim 1 by using a light-on device, wherein the light-on device comprises the light-on device comprises a first set of pins comprising first light-on testing pins for making connection to the plurality of first light-on testing pads comprised in the first set of testing pads; and first pin-miss testing pins for making connection to the first pin-miss testing pads comprised in the first set of testing pads; and a second of pins comprising second light-on testing pins for making connection to the plurality of second light-on testing pads comprised in the second set of testing pads; and second pin-miss testing pins for making connection to the second pin-miss testing pads comprised in the second set of testing pads, wherein an arrangement of the first set of pins is the same as that of the first set of testing pads corresponding to the first set of pins, and an arrangement of the second set of pins is the same as that of the first set of testing pads corresponding to the first set of pins, and the method comprising:

connecting the first light-on testing pins and the first pin-miss testing pins to the first light-on testing pads and the first pin-miss testing pads, and connecting the second light-on testing pins and the second pin-miss testing pins to the second light-on testing pads and the second pin-miss testing pads;

prior to the light-on test, simultaneously applying, from the first pin-miss testing pins, electrical signals with different voltages for a preset period of time to the two first pin-miss testing pads in the first set of testing pads that are electrically connected to one another, and determining whether a current is flowing between the two first pin-miss testing pads in the first set of testing pads that are short circuited, or simultaneously applying, from the second pin-miss testing pins, electrical signals with different voltages for a preset period of time to the two second pin-miss testing pads in the second set of testing pads that are electrically connected to one another, and determining whether a current is flowing between the two second pin-miss testing pads in the second set of testing pads that are short circuited;

in the case where a current is flowing between the two first pin-miss testing pads in the first set of testing pads that are short circuited and a current is flowing between between the second first pin-miss testing pads in the second set of testing pads that are short circuited, determining that the pins are in proper alignment; and in the case where no current is flowing between the two first pin-miss testing pads in the first set of testing pads that are short circuited or no current is flowing between the second first pin-miss testing pads in the second set of testing pads that are short circuited, determining that the pins are miss-pinned.

8. The method according to claim 7, wherein
the simultaneously applying electrical signals with different voltages for a preset period of time to the two first pin-miss testing pads in the first set of testing pads that are electrically connected to one another specifically comprises:
applying a voltage electrical signal of 0 (zero) V to one first pin-miss testing pad of the two first pin-miss testing pads in the first set of testing pads that are short circuited, and applying a voltage electrical signal of 1~2 V to the other first pin-miss testing pad.

9. The method according to claim 7, wherein a pattern generator over current protection in the light-on device is used to determine whether a current is flowing between the two first pin-miss testing pads in the first set of testing pads that are short circuited or between the two second pin-miss testing pads in the second set of testing pads that are short circuited, and wherein
when the pattern generator over current protection sounds an alarm, it is determined that a current is flowing between the two pin-miss testing pads in the same set of testing pads that are short circuited or between the two second pin-miss testing pads in the second set of testing pads that are short circuited; and
when the pattern generator over current protection does not sound any alarm, it is determined that no current is flowing between the two pin-miss testing pads in the same set of testing pads that are short circuited or between the two second pin-miss testing pads in the second set of testing pads that are short circuited.

10. The method according to claim 7, wherein the electrical signal is a transient signal, and the preset period of time is a period of time during which the transient signal is applied.

11. The method according to claim 9, wherein the pattern generator is connected to the light-on testing pin and the pin-miss testing pin.

12. A light-on device for performing a light-on test on a display substrate, wherein the display substrate comprising:
a display driving signal line; and
a first set of testing pads and a second set of testing pads, wherein the first set of testing pads comprises:
a plurality of first light-on testing pads arranged successively and connected to the display driving signal line; and
two first pin-miss testing pads electrically connected to one another while not connected to the display driving signal line,
wherein the second set of testing pads comprises:
a plurality of second light-on testing pads arranged successively and connected to the display driving signal line; and
two second pin-miss testing pads electrically connected to one another while not connected to the display driving signal line,
wherein the light-on device comprises a first set of pins comprising first light-on testing pins for making connection to the plurality of first light-on testing pads comprised in the first set of testing pads; and first pin-miss testing pins for making connection to the first pin-miss testing pads comprised in the first set of testing pads; and a second of pins comprising second light-on testing pins for making connection to the plurality of second light-on testing pads comprised in the second set of testing pads; and second pin-miss testing pins for making connection to the second pin-miss testing pads comprised in the second set of testing pads, wherein an arrangement of the first set of pins is the same as that of the first set of testing pads corresponding to the first set of pins, and an arrangement of the second set of pins is the same as that of the first set of testing pads corresponding to the first set of pins, and
wherein a first positional relationship between the first light-on testing pads and the first pin-miss testing pads is different from a second positional relationship between the second light-on testing pads and the second pin-miss testing pads.

13. The light-on device according to claim 12, further comprising:
a signal supplying circuit connected to the first pin-miss testing pin for providing electrical signals with different voltages to the two first pin-miss testing pads in the first set of testing pads.

14. The light-on device according to claim 12, further comprising:
a pattern generator over current protection (PG OCP) connected to the first light-on testing pin and the first pin-miss testing pin.

15. The light-on device according to claim 13, wherein the electrical signal is a transient signal.

16. A light-on device, comprising:
a first set of pins, wherein the first set of pins comprises:
first light-on testing pins for making connection to first light-on testing pads in a display substrate; and first pin-miss testing pins for making connection to first pin-miss testing pads in the display substrate,
wherein the first light-on testing pins are electrically connected to a display driving signal line in the display substrate while being connected to the first light-on testing pads, and
the first pin-miss testing pins are electrically connected to one another while being connected to the first pin-miss testing pads, and
a second set of pins, wherein the second set of pins comprises:
second light-on testing pins for making connection to second light-on testing pads in a display substrate; and
second pin-miss testing pins for making connection to second pin-miss testing pads in the display substrate,
wherein the second light-on testing pins are electrically connected to a display driving signal line in the display substrate while being connected to the second light-on testing pads, and
the second pin-miss testing pins are electrically connected to one another while being connected to the second pin-miss testing pads,
wherein a first positional relationship between the first light-on testing pins and the first pin-miss testing pins is different from a second positional relationship between the second light-on testing pins and the second pin-miss testing pins.

17. The light-on device according to claim 16, further comprising:
a pattern generator over current protection (PG OCP) connected to the first light-on testing pin and the first pin-miss testing pin.

* * * * *